United States Patent [19]
Chan

[11] Patent Number: 5,319,759
[45] Date of Patent: Jun. 7, 1994

[54] BURST ADDRESS SEQUENCE GENERATOR

[75] Inventor: Wan-Kan Chan, Sabah, Malaysia

[73] Assignee: Acer Incorporated, Taipei, Taiwan

[21] Appl. No.: 689,309

[22] Filed: Apr. 22, 1991

[51] Int. Cl.$^5$ .......................... G06F 12/00; G11C 8/00
[52] U.S. Cl. .................................... 395/400; 365/194;
365/230.02; 365/230.08; 365/236
[58] Field of Search .................. 395/400; 365/230.03,
365/194, 230.02, 230.08, 236

[56] References Cited
U.S. PATENT DOCUMENTS 5,126,975  6/1992  Handy et al. .................. 365/230.01

Primary Examiner—Joseph L. Dixon
Assistant Examiner—Jack A. Lane
Attorney, Agent, or Firm—Townsend and Townsend Khourie and Crew

[57] ABSTRACT

A burst address sequence generator generates a sequence comprised of $2^n$ addresses (where n is an integer greater than 1) which are compatible with an INTEL 80486 CPU burst order. A first embodiment of the burst address sequence generator latches an initial address, and uses a binary up counter and exclusive or (XOR) logic to generate the sequence of addresses. A second embodiment of the burst address sequence generator requires a shorter delay time to generate the addresses, and is comprised of a delay unit, an inverter, a counter, and a programmable logic device, such as a PAL or a PLD. Both embodiments are adaptable for use with a dynamic random access memory (DRAM). The design of each embodiment is readily applicable to generate the sequence of addresses necessary to transmit $2^n$ data units of $2^m$ bytes per unit, where both m and n are integers greater than 1.

1 Claim, 4 Drawing Sheets

| STARTING ADDRESS → | 0 | 1 | 2 | 3 |
|---|---|---|---|---|
| BIT → | 210 | 210 | 210 | 210 |
| 0 | 000 | 001 | 010 | 011 |
| 1 | 001 | 000 | 011 | 010 |
| 2 | 010 | 011 | 000 | 001 |
| 3 | 011 | 010 | 001 | 000 |
| 4 | 100 | 101 | 110 | 111 |
| 5 | 101 | 100 | 111 | 110 |
| 6 | 110 | 111 | 100 | 101 |
| 7 | 111 | 110 | 101 | 100 |

BURST ADDRESS SEQUENCE GENERATOR

BACKGROUND OF THE INVENTION

1. Field of the Invention

This invention relates to computer memory addressing, and particularly to a burst address sequence generator for producing a sequence of memory addresses that are compatible with a memory burst cycle of a microprocessor.

2. Description of the Prior Art

The pulse train burst address sequence of a central processing unit (CPU) of the INTEL 80486 is determined by the starting address. The customary technique involves using a clocked state machine to determine the burst address sequence based on the value of the starting address. To generate $2^n$ pulse train addresses, at least $(2^n)+1$ states and n outputs are required. If the state machine is implemented in the form of a programmable array logic (PAL) or a programmable logic device (PLD), then $(n+1)+n$ register outputs are required to hold the $(2^n)+1$, states in the state machine and the n bits of pulse train addresses.

When n=2, the four pulse train burst cycles will require at least $2+1+2=5$ register outputs. Or, when n=3 (as in the case of write back cache of the INTEL apogee module), the eight pulse train burst cycles will require at least $3+1+3=7$ register outputs. In this situation, there are generally only eight signals that need be input to the state machine, so a single PAL or PLD (with 20 or 24 pins) can accomplish the task.

When n=4 (not currently used in INTEL microprocessors), however, system design may make it possible to divide a 128-bit pulse train into two 64-bit pulse trains. Thus, eight 128-bit pulse train burst cycles will become 16 pulse train burst cycles. This would require a minimum of $4+1+4=9$ register outputs. In this case, the design can only be completed by adding an additional PAL or PLD.

In conclusion, for each increment of 1 in n, the required number of register outputs must be increased by at least two. With this approach, the following problems will exist: (1) the number of required PALs or PLDs must be increased as n increases; (2) because this method of implementation is not easily expandable, the state machine must be completely redesigned as n increases; (3) debugging of the new state machine design must be repeated for every increase in n.

An object of the present invention is to provide a pulse train address sequence generator which can be randomly expanded. Another object of the present invention is to provide a pulse train address sequence generator that has the following functions and effects.

1. The generator can be produced at low cost using conventional transistor- transistor logic (TTL) elements.
2. The circuitry is simple and reliable.
3. Expansion can be randomly carried out to support $2^n$ pulse train sequences.
4. Expansion can be effected by repeatedly using the identical elements without redesigning the circuit or debugging.

SUMMARY OF THE INVENTION

The present invention provides a burst address sequence generator for generating $2^n$ pulse trains (where n is an integer greater than 1) from an initial m+n bit address, $A(0, \ldots, M+n-1)$. The generated pulse train is compatible with the burst address sequence of the INTEL 80486 microprocessor. The burst address sequence generator comprises an n-bit binary counter, a transparent latch, and n XOR gates. One of the counter inputs is coupled to a first pulse train address (ZERO#) for initializing the counter. Another counter input is coupled to an increment signal (INC). At the output of the counter are n signals, $c(0, \ldots, n-1)$, representing a count.

The transparent latch is coupled to receive n address bit signals $A(m, \ldots, m+n-1)$ as an input. A second transparent latch input terminal is coupled to an address latch enable (ALE) signal. The transparent latch outputs n latched address signals $LA(m, \ldots, m+n-1)$.

The n XOR gates are each coupled through a first input to a corresponding counter output signal $C(0, \ldots, n-1)$, and through a second input to a corresponding latched address signal $LA(m, \ldots, m+n-1)$. The outputs of the n XOR gates form the n pulse train address signals $SA(m, \ldots, m+n-1)$. The address signal SA can be directly coupled to the upper address bits of a static random access memory (SRAM). The lower address bits are the lowest m bits of the initial m+n bit address, $A(0, \ldots, m-1)$.

Another embodiment of this invention is directed to a pulse train burst address sequence generator with a delay reduction function to reduce the delay time of address generation when the pulse train burst address sequence generator is used for generating dynamic random access memory (DRAM) addresses.

DESCRIPTION OF THE PREFERRED EMBODIMENT

Figure 1:
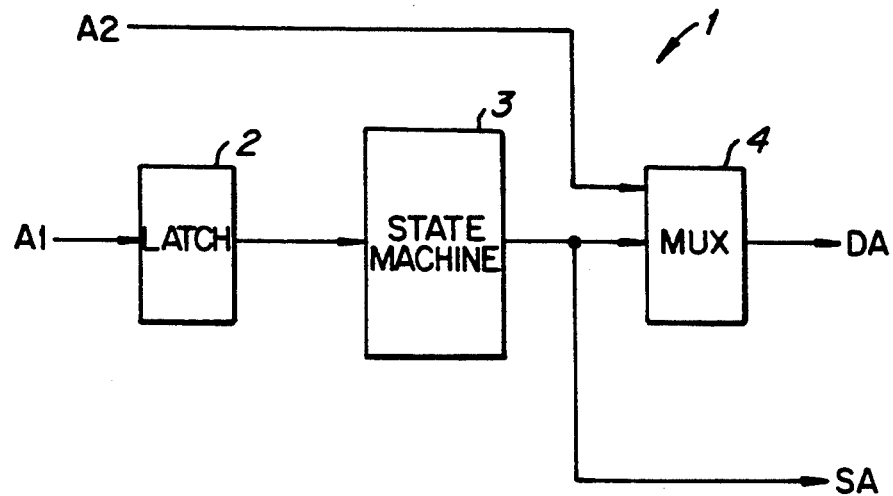
FIG. 1 is a block diagram of the conventional pulse train address sequence generating device.

FIG. 1 shows a conventional pulse train address sequence generating device 1 in which a first address signal (such as a column signal) $A_1$ is transmitted to a timing state machine 3 after being latched with a latch device 2 in order to follow a certain sequence to generate the required pulse train address signal (SA). Capable of being used directly as a static random access memory (SRAM) address, the address signal can also be transmitted (along with a second address signal, such as row signal) to a multiplexer 4 in order to obtain an address signal (MA) of a dynamic random access memory (DRAM). When the number n of the pulse train address is incremented, the problem described above will exist.

Figure 2:
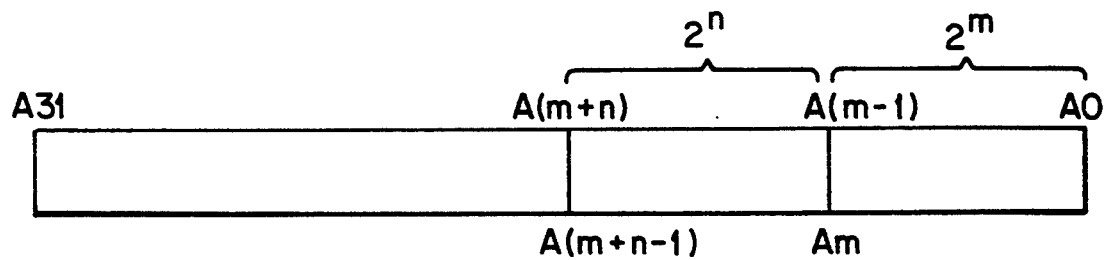
FIG. 2 is a diagram of the address bits used in generating $2^n$ pulse train addresses.

In the diagram of the address bits as in FIG. 2, $2^m$ bytes are used as the fundamental transmission unit of a circuit to generate $2^n$ pulse train burst cycles. The $2^n$ pulse train addresses have the form shown in the figure. A0 and A1 can possibly appear in the form of Intel byte enable signals BE0#-BE3#. In the case of the INTEL 80486 CPU, the fundamental unit in transmitting each pulse train is 4 bytes (m=2). Furthermore, four burst cycles can be conducted. Therefore, the circuit should generate burst addresses utilizing address bits A2 and A3. In order to generate pulse train address sequences compatible with the INTEL 80486 series CPU, the pulse train address bits $A(m, \ldots, m+n-1)$ should follow the sequence shown in the table in FIG. 3. Each pulse train sequence should be decided only by the first address, that is, the starting address. In the case of the INTEL 80486, the sequence of four pulse trains is the same as the sequence in the left upper corner within the internal box.

Figures 3, 4:
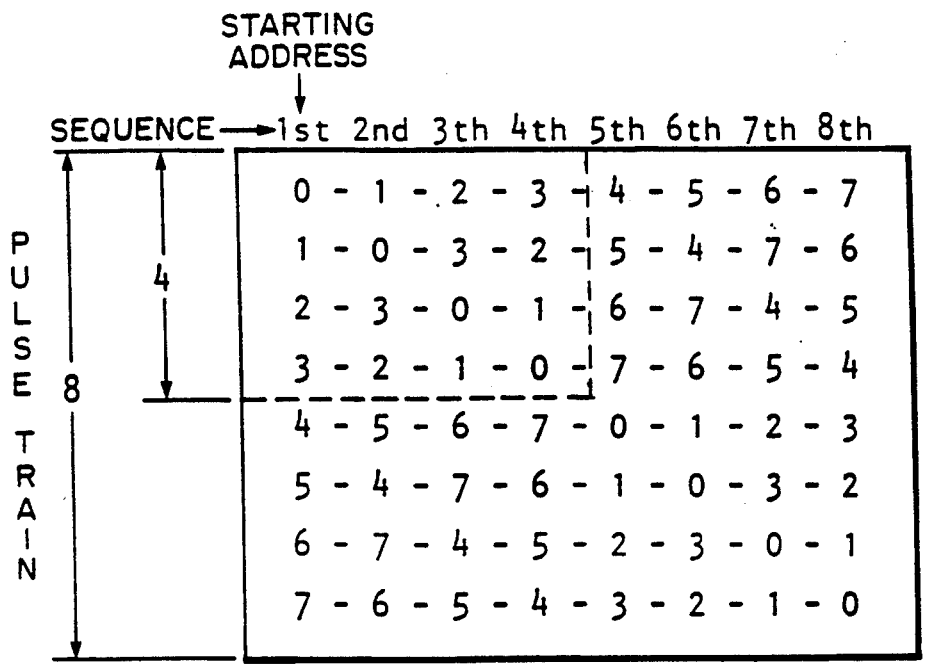
FIG. 3 is a table showing the sequence of the pulse train addresses that are compatible with the CPU of the INTEL 80486 series.
FIG. 4 is a table showing the binary representation of the identified pulse train address sequence as a function of starting address.

The table in FIG. 4, which is based on the sequence in the attached table in FIG. 3, illustrates the working principle of the present invention. By citing an example in which the set of possible starting addresses is composed of the addresses 0, 1, 2 and 3, the pulse train address sequence can be obtained by rewriting the addresses in binary form. By carefully observing the binary form diagram, it can be seen that the binary sequence with the starting address of 0 is actually the result of a binary up counting. On viewing the other binary sequence, it can be seen that the i-th ($i=0, \ldots, n-1$) bit of j ($j=0, 1, \ldots, 2^n-1$) pulse trains, and the i-th bit of binary value with the j-th starting address of 0 will simultaneously change their values (that is, 0 1). However, for each sequence,

- for the value of bit 0, there is one phase reversal for each increment of 1 in the count;
- for the value of bit 1, there is one phase reversal for each increment of 2 in the count; and
- for the value of bit $n-1$, there is one phase reversal for each increment of $2^n$ in the count.

From this observation it can be seen that each incrementing of the binary up counter can be used to tell at what time the phase reversal should occur for various bits in a sequence with a time base.

It can further be discovered from sequences shown in FIG. 4 using starting addresses other than 0, that in addition to the simultaneous state conversion of the binary bit count for bit i in the sequence, the change into 1 or 0 will be determined by the bit i of the starting address.

If the value of the bit i of the starting address is 1, then in the sequence, the value of bit i is just the reverse of the value of the corresponding bit i in the j pulse train of the binary counter.

Conversely, if the value of the starting address bit i is 0, then the value of bit i is equal to the value of bit i in the corresponding binary counter. In other words, the values change simultaneously into 1 or 0. This means that the value of address bit i in a j-th pulse train (represented as Ai and j, respectively) is related, by means of an XOR operation (expressed as :+:), to bit i of count j (expressed as $C_{i,j}$) in the binary counter. In other words, $$A_{i,j} = C_{i,j} :+: A_{i,0} \qquad \text{Formula (1)}$$

where $A_{i,0}$ is the starting address.

Figure 5:
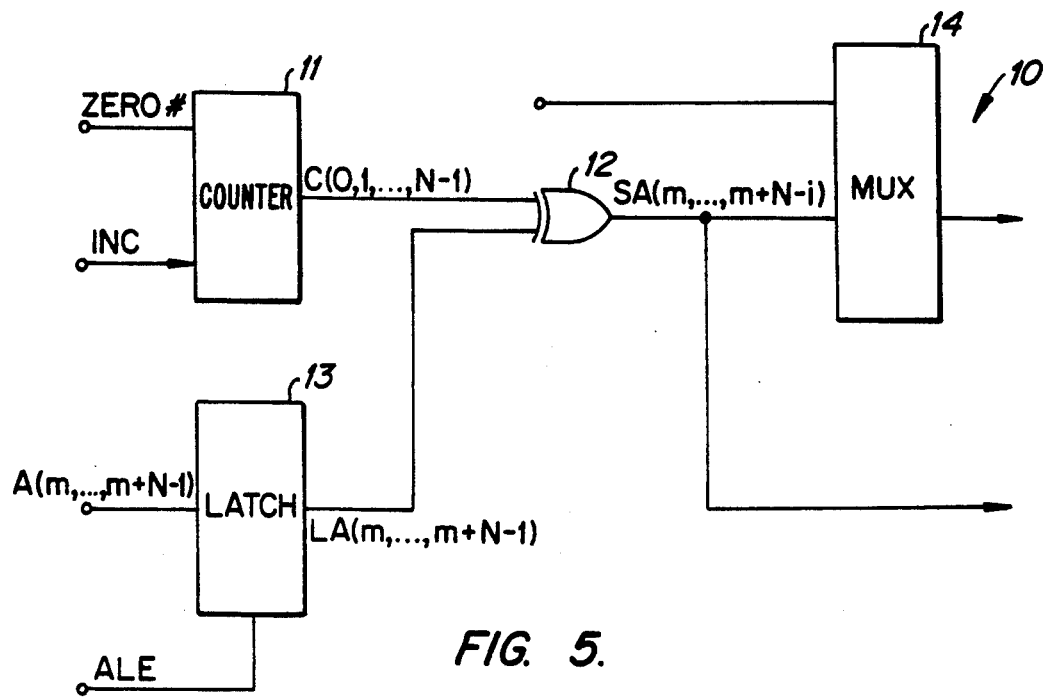
FIG. 5 is a block diagram of a first embodiment of a pulse train address sequence generator in accordance with the present invention.

Based on formula (1), the logic circuit shown in FIG. 5 can be directly designed. There, $$SA(m+j) = LA(m+j) :+: C(j) \qquad \text{Formula (2)}$$

where $j=0, \ldots, n-1$; LA is the latched starting address A; and SA is the pulse train address. Formula (2) shows the method for connecting the individual XOR gates in a particular circuit. If $2^n$ is required, there should be one n bit binary up counter and n XOR gates.

In FIG. 5, the pulse train burst address sequence generator 10 is used to generate $2^n$ pulse train address sequences (n is an integer greater than or equal to 1), and includes the following: one n-bit binary up counter 11, whose first input terminal inputs a signal for initializing the count to a first pulse train address (ZERO#), and a second input terminal that inputs an increment signal (INC) for triggering the input. The output terminal of the counter 11 is n count signals $C(0, 1, \ldots, n-1)$, each of which is connected to a corresponding one of n XOR gates 12; one transparent latch 13, having input terminals which input a corresponding one of the n address bit signals $A(m, \ldots, m+n-1)$ (in other words, the size of each transmitted data is $2^m$ bytes for $2^n$ pulse train burst cycles; $A_0 \sim A_{M-1}$ is the constant low address bits of each transmitted $2^m$ bytes) and one address latch enable signal (ALE). The output is the n latched address signals $LA(m, \ldots, m+n-1)$. The n count signals $C(0, 1, \ldots, n-1)$ and n latched address signals $LA(m, \ldots, m+n-1)$ are coupled to the n corresponding inputs of the XOR gates 12. $A(m, \ldots, m+n-1)$ is the starting address. After the transparent latch 13 locks A, $A(m, \ldots, m+n-1)$ can be randomly varied. If the starting address does not change in the entire cycle of pulse train transmission, this transparent latch 13 is not necessary; $A(m, \ldots, m+n-1)$ can replace $LA(m, \ldots, m+n-1)$ and be directly coupled to the n-th corresponding XOR gate 12 in order to obtain n pulse train address signals $SA(m, \ldots, m+n-1)$ to be directly coupled either to a static random access memory (SRAM) or to a multiplexer 14 in order to become an address signal of a dynamic random access memory (DRAM).

Figure 6:
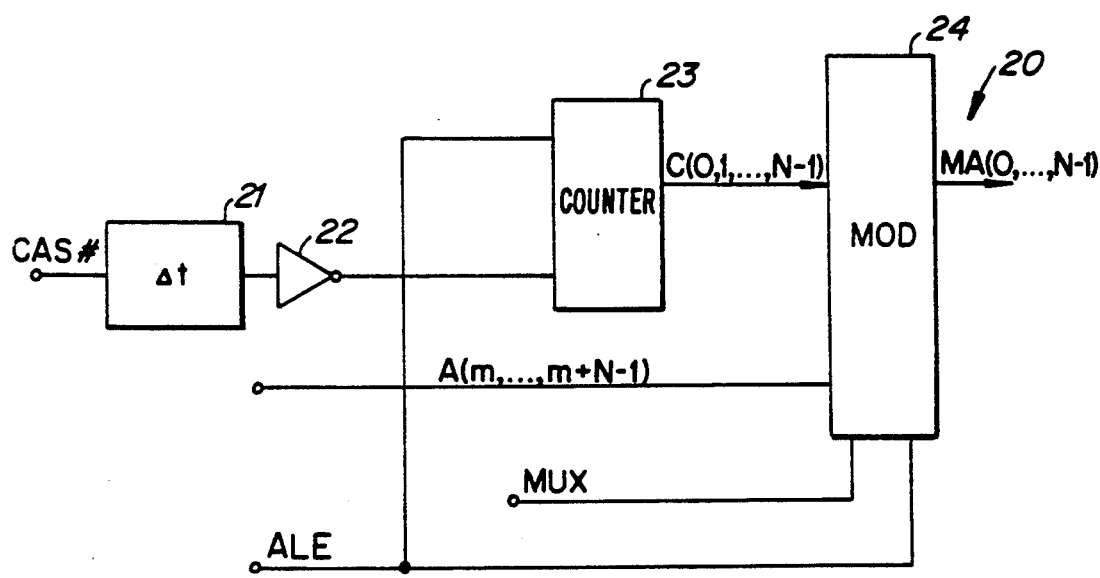
FIG. 6 is a block diagram of a second embodiment of a pulse train address sequence generator in which the delay in generating the pulse train address sequence is reduced.

Since the XOR gate 12 and the multiplexor 14 in FIG. 5 have two levels of delay, in order to reduce to one delay level, a module for a dynamic random access memory (DRAM) is used to change FIG. 5 into the circuit as shown in FIG. 6.

FIG. 6 shows a pulse train sequence generating device 20 capable of reducing the delay in generating the pulse train address, including the following: one delay unit 21 which is used to delay the CAS# a delay time $\Delta t$ (CAS# is the signal for capturing the column address for access of data of dynamic RAM; however, $\Delta t > t_{cah}$ ($t_{cah}$ is the retaining time after changing act at CAS# for the column address); one phase inverter 22 to be used for coupling the delayed, phase-reversed CAS# to a counter 23 to cause an increment of the counter. Another input terminal of the counter 23 receives the ALE signal for initializing the count in order to generate the first pulse train address. The output terminal of the counter 23 is n counting signals $C(0, 1, \ldots, n-1)$. In addition, one module 24, constructed from one PAL or one PLD, contains n corresponding latches, multiplexors, and XOR gates. The input terminals of the module 24 are coupled to a corresponding counting signal, a corresponding address signal $(A(m, \ldots, m+n-1)$, a corresponding row address RA(0, 1, . . . , n−1), one multiplexer multiplexing selection signal, Mux, to be used to select the address of the dynamic memory as column or row address and an address latch enable signal (ALE). The output is address MA(0, . . . , n−1) of the dynamic memory. When the ALE is of high value (or low value), the A address signal is locked into a latched signal LA (totalling 0, 1, . . . , n−1 in n corresponding LA signals). However, when the ALE signal is a low value (or high value), the latch is transparent, so the A address signal is directly gated to become the MA signal (totalling n corresponding signals (0, 1, . . . , n−1)). In the pulse train address sequence generator 20, in addition to executing the latch function in the logic device PAL or PLD, there should be functions of XOR gate and multiplexer to be used in executing the function corresponding to transparent latch 13, XOR gates 12 and multiplexor 14 in FIG. 5. The following are the equations for the module 24:

$$MA(i) = Mux*RA(i) + /Mux*A(m+i)*/ALE + /-Mux*(LA(m+1):+:C(i))*ALE \qquad \text{Formula (3)}$$

where
LA(m+i) is the latched address signal A(m+i),
RA(i) is the corresponding row address,
A(m+i) is the starting address,
"+" is OR logic,
"*" is AND logic,
":+:" is XOR logic,
Mux is the multiplexing selection signal,
/ALE is the phase reversed ALE signal, and
/Mux is the phase reversed Mux.

Figure 7:
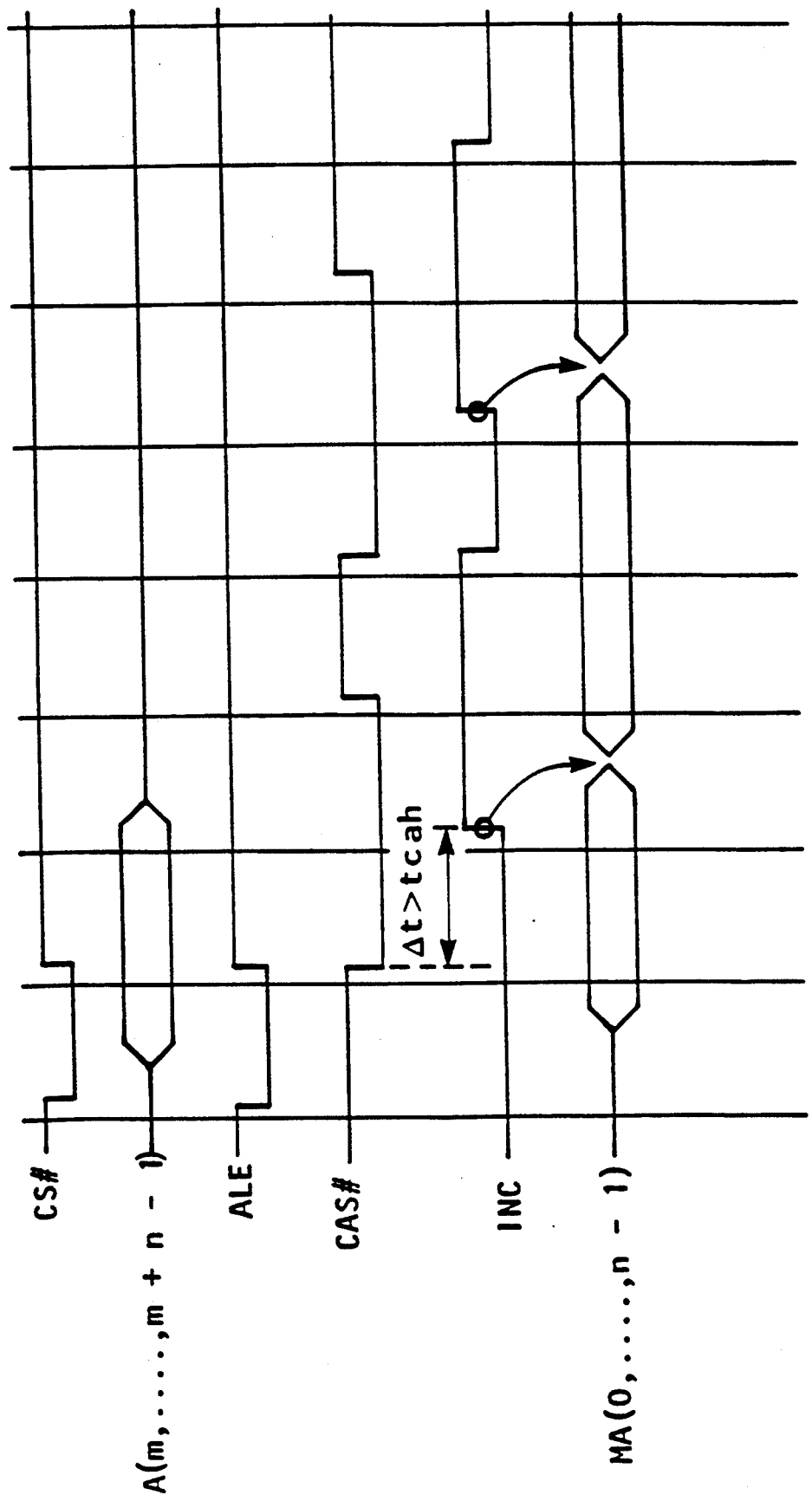
FIG. 7 is the timing diagram showing the signals generated by the pulse train address sequence generator of FIG. 6.

The timing of the operation in FIG. 6 is shown in FIG. 7. In FIG. 7, CS# (CYCLE START) is a transmitting cycle start signal; when the signal is at a low value, the starting address A will be transmitted. ALE becomes a low value at the same time as CS#. At this time, the counter should reset to be initialized because each pulse train transmission should begin from the starting address that is relative to a C value equal to 0. When ALE is LOW, the counter is cleared. In addition, from formula (3), we know that if the Mux signal is a low value, MA is derived directly from A. In other words, at that time A is gated directly to MA because the time required to generate MA from the logic C:+:A will not satisfy the address access time (tAA) of SRAM. The reason for this is that the time is too long from ALE to clear c to zero in counting. For each increment of the counter, based on formula (1) an instruction is given to the XOR logic to generate a pulse train address. However, the counter generates increments (INC) in response to an increment trigger that is delayed in comparison with the CAS# before phase reversal. Thus, when completing one transmission of pulse train data, the CAS# completes a cycle from high value to low value and increment returns to high value; the counter then automatically has an increment of one.

What is claimed is:
1. A pulse train burst sequence generator for generating $2^n$ pulse train address sequences from a starting address, A(0, . . . , m+n−1), where n is an integer greater than 1, comprising:

delay means having an input coupled to a column address strobe (CAS#) signal, said delay means producing at its output a delayed copy of the CAS# signal, said delay being greater than the retaining time of a column address;

a phase inverter coupled to the delayed CAS# signal, for producing an inverted delayed CAS# signal;

an n-bit binary up counter for generating an ascending sequence of numbers, having a first input terminal coupled to a signal for initializing the count to zero, a second input terminal coupled to the inverted delayed CAS# signal for triggering a count operation of the counter, and an output terminal comprising n count signals, C(0, . . . , n−1);

a logic device coupled to the n count signals (C(0, . . . , n−1)), n address signals (A(m, . . . , m+n−1)), n row address signals (RA(0, 1, . . . , n−1)), a multiplexer selection signal (MUX), and an address latch enable signal (ALE), for producing n dynamic memory address signals (MA(0, . . . , n−1)), wherein the logic device includes n latches coupled to the n address signal (A(m, . . . , m+n−1)) for storing an initial value of the n address signals (LA(m, . . . , m+n−1)), and wherein further each dynamic memory address signal MA(i) (where i is an integer from 0 to n−1) has the following relationship to the inputs:

$$MA(i) = Mux*RA(i) + /Mux*A(m+1)*/ALE + /-Mux*(LA(m+i):+:C(i))*ALE,$$

where
"*" represents a logical AND operation,
"+" represents a logical OR operation,
"/" represents a logical NOT operation, and
":+:" represents a logical EXCLUSIVE OR operation.

* * * * *